United States Patent [19]

Tanaka

[11] Patent Number: 5,455,383
[45] Date of Patent: Oct. 3, 1995

[54] SHIELD FLAT CABLE

[75] Inventor: Keiichi Tanaka, Tochigi, Japan

[73] Assignee: Sumitomo Electric Industries, Ltd., Osaka, Japan

[21] Appl. No.: 164,810

[22] Filed: Dec. 10, 1993

[30] Foreign Application Priority Data

| Jan. 26, 1993 | [JP] | Japan | 5-028496 |
| Jun. 4, 1993 | [JP] | Japan | 5-158071 |

[51] Int. Cl.$^6$ ............................................. H01B 7/34
[52] U.S. Cl. ................... 174/36; 174/117 FF; 174/117 A
[58] Field of Search .................... 174/36, 117 F, 174/117 FF, 117 A

[56] References Cited

U.S. PATENT DOCUMENTS

| 2,808,352 | 10/1957 | Coleman et al. | 174/117 A |
| 3,475,213 | 10/1969 | Stow | 174/117 A |
| 3,762,946 | 10/1973 | Stow et al. | 174/117 A |
| 3,778,306 | 12/1973 | Stow | 174/117 A |
| 4,209,215 | 6/1980 | Verma | 174/35 R |
| 4,663,079 | 5/1987 | Yamaguchi et al. | 174/102 R |
| 5,003,126 | 3/1991 | Fujii et al. | 174/36 |
| 5,008,488 | 4/1991 | Nakagawa | 174/36 |
| 5,037,999 | 8/1991 | VanDeusen | 174/36 |

FOREIGN PATENT DOCUMENTS

| 0452942 | 10/1991 | European Pat. Off. | |
| 112014 | 5/1991 | Japan | 174/36 |
| 108207 | 5/1991 | Japan | 174/36 |
| 2227033 | 7/1990 | United Kingdom | 174/36 |
| 2253936 | 9/1992 | United Kingdom . | |

*Primary Examiner*—Morris H. Nimmo
*Attorney, Agent, or Firm*—Cushman Darby & Cushman

[57] ABSTRACT

A shielded flat cable having a shield layer formed of an adhesive resin layer containing metal fillers. The adhesive resin adheres to both an insulation layer and one or more conductors of the flat cable. The shield layer can also include a nonflammable substrate onto which the adhesive resin is disposed.

5 Claims, 2 Drawing Sheets

SHIELD FLAT CABLE

BACKGROUND OF THE INVENTION

The present invention relates to a structural improvement in a shielded flat cable. More particularly, the present invention relates to a shielded flat cable having improved conduction to a ground line and bending properties that are superior to conventional flat cables.

Signal transmission in devices such as communication mechanisms and computers, and in the interface between such devices, is conventionally achieved with flat cables. However, conventional flat cables present a problem with shielding electromagnetic waves. Although various techniques have been advanced for solving this problem, no sufficient technique has yet been proposed.

Shielded flat cables employing gold foil as the shield layer are known. The structure of shielded flat cables having such a metal foil as the shield layer requires an adhesive layer in order for the metal foil to adhere to the flat cable. And to make conduction after the shield tape has been wound and adhered, it is necessary to remove the adhesive layer by, for example, spot welding.

SUMMARY OF THE INVENTION

The present invention relates to a shielded flat cable in which the shield layer of a conductive adhesive layer is comprised of an adhesive resin containing metal fillers. The adhesive resin of the present invention has adhesiveness to both the insulation layer and at least one conductor of a flat cable. With the shielded flat cable of the present invention, both adhesion and conduction can be satisfied by contacting the shield layer with a ground line, and with the application of simple heat and pressure.

DETAILED DESCRIPTION OF THE PREFERRED EMBODIMENTS

Figure 1A:
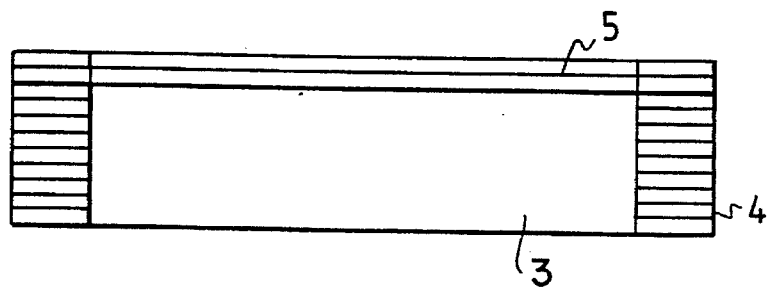
FIG. 1(a). This figure shows the structure of a conventional flat cable before the shield tape has been applied. Shown in this figure are four conductors (4) and a ground line (5).
Figure 1B:
FIG. 1(b). This figure shows a cross-sectional view of a conventional shield tape. The shield tape depicted in this figure is comprised of an adhesive (3) which is coated onto a substrate (1) through a metal foil (2).
Figure 1C:
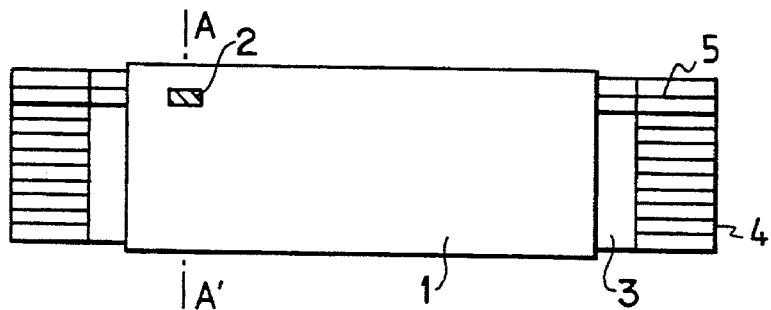
FIG. 1(c). This figure shows the structure of a conventional flat cable after a shield tape has been applied.
Figure 1D:
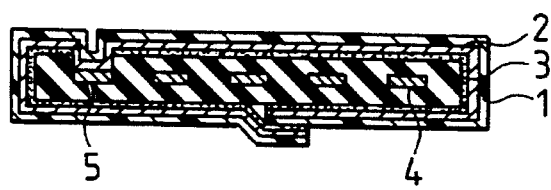
FIG. 1(d). This figure shows a cross-sectional view of FIG. 1(c) along the A—A' line. Four conductors (4) and a ground line (5) are depicted in this figure. The conductors and ground line of this figure are surrounded by the shield tape described in FIG. 1(b).
Figure 2A:
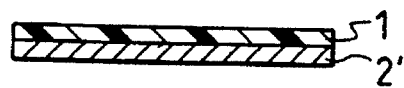
FIG. 2(a). This figure shows a cross-sectional view of a shield tape used for producing the shielded flat cable of the present invention. The shield tape depicted in this figure is comprised of a substrate (1) which has coated onto it an adhesive resin containing metal fillers (2').
Figure 2B:
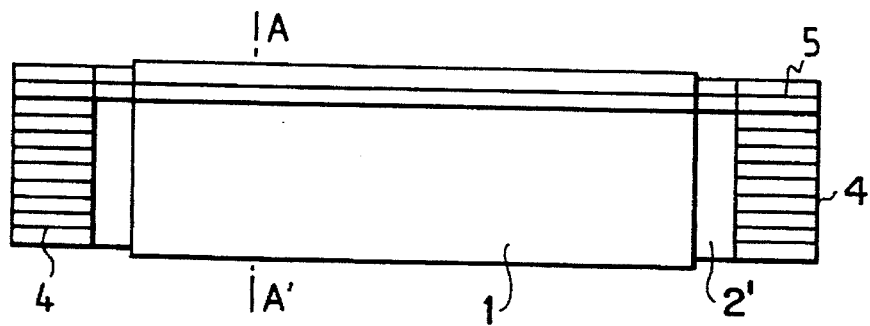
FIG. 2(b). This figure shows the structure of a shielded flat cable after the shield tape has been applied.
Figure 2C:
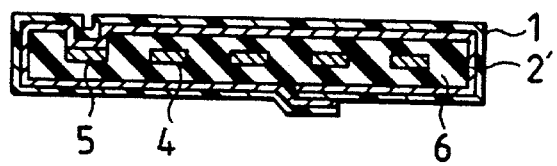
FIG. 2(c). This figure shows a cross-sectional view of FIG. 2(b) along the A—A' line. Four conductors (4) and a ground line (5) are depicted in this figure. The conductors and ground line are substantially embedded in an insulation layer (6). Substantially surrounding the conductors, ground line and insulation layer of this figure is the shield tape described in FIG. 2(a).

According to the present invention, a shield substrate is coated with an adhesive resin layer, said adhesive layer being, for example, an adhesive-type or a hot melt-type. The adhesive resin of the present invention contains metal fillers, as shown in FIG. 2(a), and is wound on a flat cable with a continuously or partially exposed ground line, as shown in FIG. 2(b). The cable is heated and pressurized to cause the shield layer to adhere to an insulation layer of the flat cable, and to contact the shield layer to the ground line, as shown in FIG. 2(c).

Substrates of the present invention include, for example, a nonflammable engineering plastic film. The electric wire tape formed thereby is capable of passing the UL (Underwriter Laboratory) nonflammable test.

Adhesive resins of the present invention include, for example, a hot melt adhesive of a polystyrene system, vinyl acetate system, polyethylene system, polypropylene system, polyester system or polyamide system, or an adhesive of a rubber system, acryl system, vinyl system, such as, for example, polyvinyl ether, or silicone system.

It is desirable that the adhesive resin of the present invention have an adhesiveness to both the insulation layer and at least one conductor of the flat cable. A polyester system hot melt adhesive is preferred.

Metal fillers of the present invention include, for example, a metal powder of nickel, copper, silver or similar metal; an alloy powder of solder or similar material; metal whiskers; a glass woven material plated with a metal and cut into chip-shaped pieces; or carbon particles plated with a metal.

A specific mixing ratio of metal fillers to adhesive resin is not required, provided the shield layer formed from these two components is effective in shielding against electromagnetic waves. In those instances where a specific mixing ratio is necessary, the ratio of metal fillers to adhesive resin is affected by the kind, shape, size, specific gravity and like features of the metal fillers. The metal fillers are generally 20–300 parts by weight for a 100 parts by weight of adhesive resin. The amount of metal fillers is preferably 100–200 parts by weight.

As a method of producing the shield layer from the adhesive resin, previously coating a shield substrate with the resin is preferred. When the shield substrate of the present invention is a nonflammable engineering plastic film, such as, for example, polyphenyl sulphide (PPS), polyamidimido, polyetherimido or polyarylate, the flat cable formed therewith is capable of passing the UL nonflammable test.

Conductors of the present invention include, for example, copper or tin-plated copper.

The following non-limiting examples illustrate the invention in more detail.

EXAMPLES

A flat cable, such as that shown in FIG. 2(c), was constructed such that a plurality of flat tin-plated soft copper foils, each having a thickness of 0.1 mm and a width of 0.8 mm, were arranged with a pitch of 1.25 mm between conductors and were covered with a polyester tape. One surface of one conductor of the flat cable was made to be continuously exposed in the longitudinal direction. A shield substrate coated with a polyester system hot melt adhesive, containing silver fillers and having a thickness of 12 μm, was wound on the polyester tape having a thickness of 9 μm. Heat and pressure were then applied so that the shield substrate adhered to the flat cable and conduction to the exposed conductor could be easily achieved.

In the present example, a PPS film was used as the shield substrate. Other materials that could be employed as the shield substrate include, for example, polyamideimido film, polyetherimido film and polyarylate film.

Figure 3:
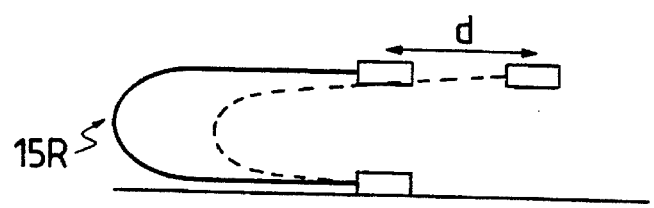
FIG. 3. This figure shows the shielded flat cable of the present invention with a predetermined curvature. This figure further shows the bending properties of a shielded flat cable of the present invention.

By using an adhesive resin which contains metal fillers to form the shield substrate of the present invention, as opposed to the metal foil of conventional flat cables, it was discovered that a thin shield layer—adhesive resin layer—not greater than 20 μm could be formed. Additionally, the bending properties of a movable portion of the shielded flat cables of the present invention, (see Table 1), was superior to that of the conventional art, even when the shielded flat cable was repeatedly bent under the following conditions: (1) a moving distance of 25 mm; (2) a moving speed of 1000 times/minute; and (3) a bending of the cable up to 15 R (a radius 15 mm). (See FIG. 3.)

TABLE 1

|  | First Test* | Second Test* | Third Test* |
| --- | --- | --- | --- |
| Conventional Flat Cables | 2,025 | 2,439 | 2,705 |
| Shielded Flat Cables of Present Invention | 31,520 | 29,451 | 33,550 |

*The values shown in Table 1 represent the number of times the flat cables were bent before conductors were broken.

The shielded flat cables of the present invention, as described above, exhibit the following superior characteristics: (1) conduction between the shield layer and the ground is easily accomplished; (2) the shielded flat cables can be made thin and demonstrate bending properties that are superior to those conventionally known; and (3) when a nonflammable engineering plastic film is used as the shield substrate, the flat cable is capable of passing the UL nonflammable test.

What is claimed is:

1. A shielded flat cable comprising:
   a plurality of conductors; an insulation layer into which said conductors are embedded;
   an adhesive resin shield layer surrounding said insulation layer, wherein said adhesive resin is selected from the group consisting of a polystyrene system hot melt adhesive, a vinyl acetate system hot melt adhesive, an AVB resin system hot melt adhesive, a polyethylene system hot melt adhesive, a polypropylene system hot melt adhesive, a polyester system hot melt adhesive, a polyamide system hot melt adhesive, a rubber system adhesive, an acryl system adhesive, a vinyl system adhesive, and a silicone system adhesive, further wherein said adhesive resin contains metal fillers, and additionally wherein said adhesive resin has adhesiveness to both said insulation layer and at least one of said conductors.

2. The shielded flat cable of claim 1, further comprising a substrate onto which said adhesive resin is disposed, said substrate being a nonflammable plastic film.

3. The shielded flat cable of claim 1, wherein said metal fillers are selected from the group consisting of a nickel powder, a copper powder, a silver powder, a solder alloy powder, a metal whisker, particles of a glass woven material plated with a metal, and a carbon particles plated with metal.

4. The shielded flat cable of claim 1, wherein the ratio of said metal fillers to the said adhesive resin is 20–300 parts by weight of said metal fillers to 100 parts by weight of said adhesive resin.

5. The shielded flat cable of claim 1, wherein the thickness of said adhesive resin is not greater than 20 μm.

\* \* \* \* \*